United States Patent
Zitzmann

(10) Patent No.: US 6,543,102 B1
(45) Date of Patent: Apr. 8, 2003

(54) SENSOR COMPONENT

(75) Inventor: Heinrich Zitzmann, Lauf (DE)

(73) Assignee: Sensotherm Temperatursensorik GmbH, Nuremberg (DE)

(*) Notice: Subject to any disclaimer, the term of this patent is extended or adjusted under 35 U.S.C. 154(b) by 0 days.

(21) Appl. No.: 09/647,255

(22) PCT Filed: Mar. 16, 1999

(86) PCT No.: PCT/EP99/01723

§ 371 (c)(1),
(2), (4) Date: Dec. 13, 2000

(87) PCT Pub. No.: WO99/49285

PCT Pub. Date: Sep. 30, 1999

(30) Foreign Application Priority Data

Mar. 26, 1998 (DE) .......................................... 198 13 468

(51) Int. Cl.⁷ ................................................ H01C 3/04
(52) U.S. Cl. ...................... 25/309; 338/309; 338/275; 338/314; 29/612
(58) Field of Search ................. 338/25, 309, 22 R, 338/225 D, 314, 275, 256, 203; 29/612

(56) References Cited

U.S. PATENT DOCUMENTS

| | | | | |
|---|---|---|---|---|
| 4,213,113 A | * | 7/1980 | Brandt et al. ................ | 338/309 |
| 4,306,217 A | * | 12/1981 | Solow .......................... | 338/275 |
| 4,400,684 A | * | 8/1983 | Kushida et al. ................ | 338/25 |
| 4,903,001 A | * | 2/1990 | Kikuchi ..................... | 338/22 R |
| 4,909,079 A | * | 3/1990 | Nishimura et al ....... | 73/204.27 |
| 4,920,635 A | * | 5/1990 | Yajima ......................... | 29/612 |
| 5,124,682 A | * | 6/1992 | Ishiguro .................... | 338/22 R |
| 5,168,256 A | * | 12/1992 | Ishiguro et al. ................ | 338/25 |
| 5,252,944 A | * | 10/1993 | Caddock, Jr. ................ | 338/275 |
| 5,321,386 A | * | 6/1994 | Ishiguro ...................... | 338/269 |
| 5,432,357 A | * | 7/1995 | Kato et al. ..................... | 257/77 |
| 5,610,572 A | * | 3/1997 | Yajima ..................... | 338/22 R |
| 5,735,606 A | * | 4/1998 | Tani et al. ................... | 374/185 |
| 5,763,929 A | * | 6/1998 | Iwata | |
| 5,831,512 A | * | 11/1998 | Wienand et al. ............. | 338/25 |

FOREIGN PATENT DOCUMENTS

| | | | | |
|---|---|---|---|---|
| JP | 552668 | 3/1993 | ............. | G01K/7/18 |
| JP | 6-137959 | 5/1994 | ............. | G01K/7/18 |

* cited by examiner

Primary Examiner—Karl D. Easthom
(74) Attorney, Agent, or Firm—Glenn Patent Group; Michael A. Glenn; Kirk D. Wong

(57) ABSTRACT

A sensor component comprises a ceramic support (12) with a metal film (14) applied thereto. At least one connecting wire (16) is electrically connected to the metal film (14) in a contact area (18). A fixing glaze (20) is applied to the metal film (14) and the at least one connecting wire (16) in the contact area (18). The ceramic support (12) has at least one recess (24) in the area of the fixing glaze (20).

18 Claims, 2 Drawing Sheets

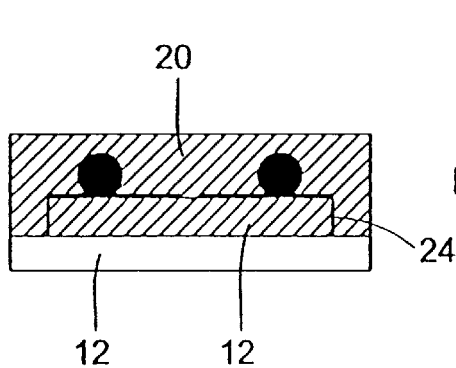 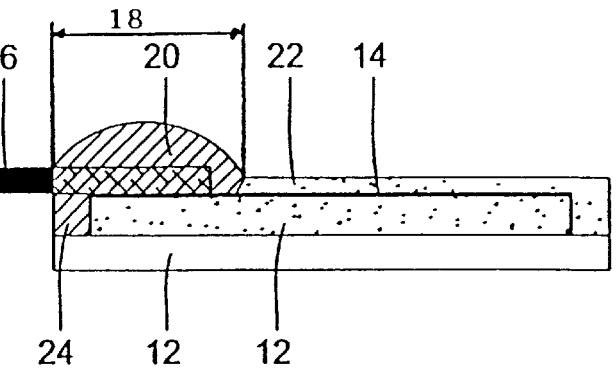
FIG.1a  FIG.1b
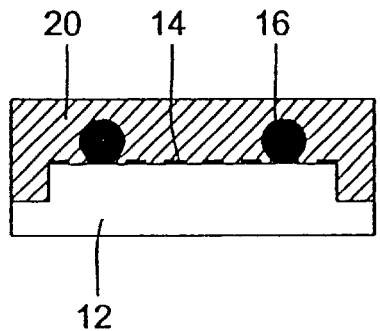
FIG.2
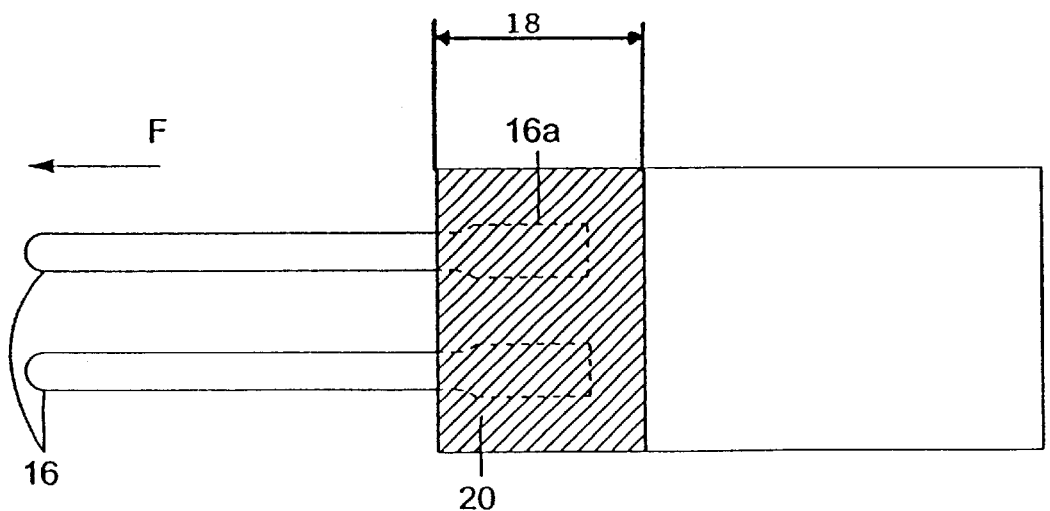
FIG.3

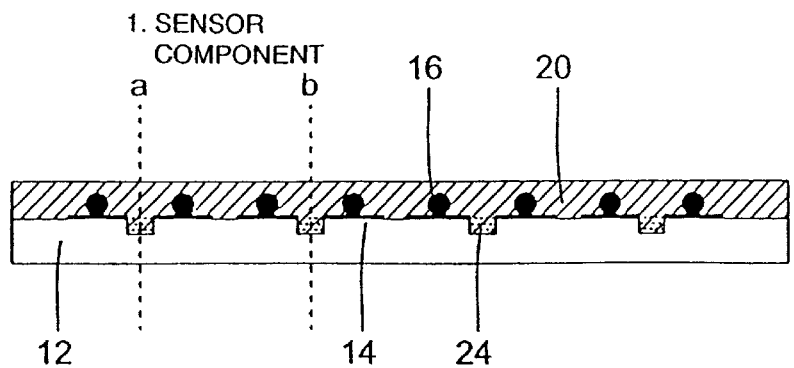
FIG.4
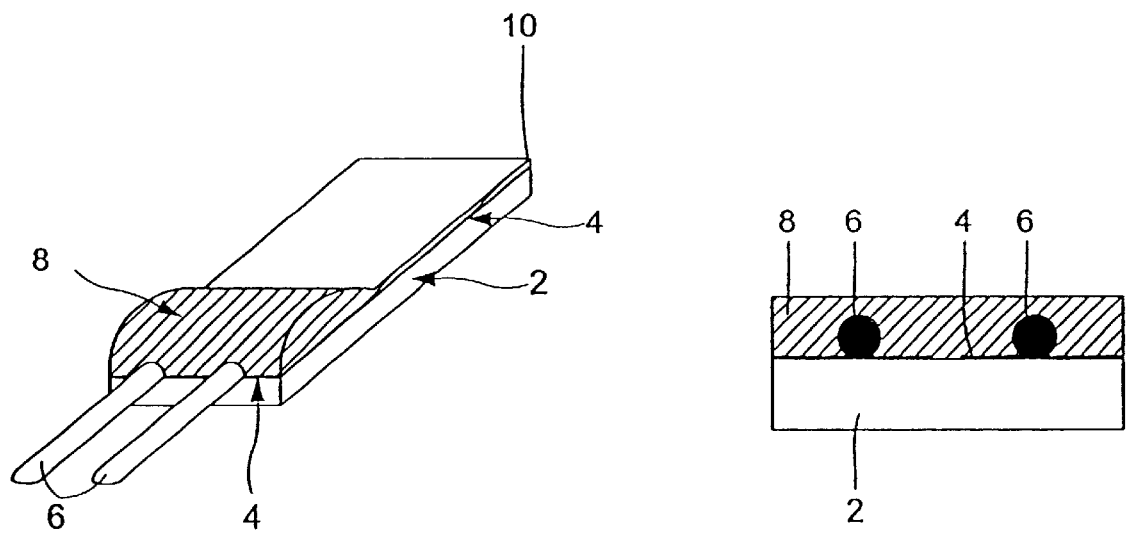
FIG. 5a
(PRIOR ART)
FIG. 5b
(PRIOR ART)

SENSOR COMPONENT

The present invention relates to sensor components and especially to sensor components with an improved and more reliable contact arrangement between the sensor and connecting wires attached thereto.

Sensor components are nowadays used e.g. as temperature sensors or also as air- or gas-flow sensors. For detecting a temperature, temperature sensor components made of platinum are, for example, used for determining the ambient temperature. A platinum temperature sensor component functions such that a temperature variation in the surroundings of the platinum temperature sensor component causes a resistance change in a platinum film arranged in the component. This resistance change can be detected by a measuring circuit and evaluated with respect to the ambient temperature so that the temperature of the surroundings in which the platinum temperature sensor component is arranged can be determined.

A conventional platinum temperature sensor component is shown in FIG. 5. A support material 2 consisting of a ceramic material, e.g. $Al_2O_3$ ceramic, has applied thereto a structured platinum film 4. In a connection and contact area two connecting wires 6 are electrically connected to the platinum film 4. A fixing glaze 8 is applied to the connecting wires 6 and the platinum film 4 in the contact area. Outside of the contact area, the platinum film 4 is coated with a glass passivation layer 10 so as to protect the plastic film 4 against environmental influences. The fixing glaze 8 is provided for mechanically fixing the connecting wires 6 to the sensor component via this glaze composition applied to the contact area.

This configuration provides a sufficient and reliable contact quality for many cases of use. For very difficult cases of use with high mechanical, thermal and chemical loads on the sensor component, this configuration will, however, entail substantial limitations.

The contact quality between the connecting wires 6 and the sensor component is essentially determined by the adherence of the platinum film 4 to the ceramic support 2. The originally sufficient adherence of the platinum film 4 can, however, be markedly reduced or even disappear e.g. due to slightly different coefficients of thermal expansion of the ceramic material (e.g. $Al_2O_3$ ceramic) and of platinum, due to frequently occurring and extreme temperature variations (20° C. to 800° C.) and due to simultaneously occurring outer mechanical strains or loads or due to an aggressive ambient chemical atmosphere. When the sensor components are exposed to adverse conditions for a very long period of time (e.g. months, years), this may lead to electrical as well as mechanical contact problems in the contact area between the connecting wires 6 and the platinum film 4.

Since the sensor components are frequently exposed to very hard mechanical, thermal and chemical loads in practical use, these high loads will normally affect both the actual sensitive area and especially also the contact zone of the outwardly extending electrical connections.

Since the individual layers of a conventional platinum temperature sensor component are arranged one on top of the other with open lateral parting layers, disturbing environmental influences may additionally act on the sides of the exposed individual edges of the superimposed layers. Over a prolonged period of time, this may cause damage to the platinum layer and it may also cause the platinum layer to detach itself from the ceramic body or the glass passivation layer.

In addition, a mechanical load is frequently applied to the contact area via the connecting wires. The mechanical forces acting on the contact area may have the effect that an already affected mechanical connection between the individual layers may perhaps be impaired still further, and this may lead to even stronger damage or, in the worst case, to destruction of the sensor component. The service life of the sensor component will, however, be markedly reduced in any case, and, if the sensor component is damaged, it may also happen that the detected measuring results are influenced or corrupted.

Jp 06-137959 A describes a platinum temperature sensor component in the case of which an extension conducting wire and its connection point to a main conducting wire are to be protected against breaking caused by bending in that the connection point is covered with an insulator having a certain strength, whereas the extension conducting wire is covered with a flexible coating.

Starting from this prior art, it is the object of the present invention to provide a sensor component with a more reliable and more resistant contact arrangement.

The object of the present invention is achieved by a sensor component according to claim 1 and by a method of producing a sensor component according to claim 8.

The sensor component of the present invention comprises a ceramic support, a metal film applied to the ceramic support, at least one connecting wire electrically connected to the metal film in a contact area, and a fixing glaze applied to the metal film and the at least one connecting wire in the contact area, the ceramic support of the sensor component having at least one recess in the area of the fixing glaze.

The present invention additionally provides a method of producing a sensor component comprising the following steps: applying a metal film to a ceramic support, providing at least one recess in the ceramic support, electrically connecting the metal film to at least one connecting wire in a contact area, applying a fixing glaze composition to the connecting wire, the metal film and the at least one recess in the contact area, and fusing the fixing glaze composition to the ceramic support.

The present invention is based on the finding that the contact quality between the sensor component and the lead-in wires can substantially be improved by providing additional mechanical interlocking between the fixing glaze and the ceramic support. This additional mechanical interlocking is achieved by providing recesses in the ceramic support during the production of the sensor component; also the metal film is removed at the locations of these recesses. These trenches are then filled with a suitable glass composition. When the connecting wires have been bonded to the contact surfaces provided, this contact area is encompassed by a fixing glaze composition and fused at a high temperature. In the course of this process, the fixing glaze composition will fuse not only with the platinum film but also with the glass composition arranged laterally to this platinum film in the recesses. The glass composition in the recesses can be formed by the fixing glaze composition itself or it can also be applied to the recesses separately prior to the fusion step, a uniform and permanent fixing of the connecting wires in the contact area of the sensor component being achieved by fusing the fixing glaze with the substrate support. The recesses in the ceramic material can, in addition, also be arranged on the front where the connecting wires leave the contact area.

One advantage of the present invention is to be seen in the fact that, due to the interlock between the fixing glaze composition and the ceramic support, a substantially improved mechanical stability of the contact between the connecting wires and the connection areas of the metal film is achieved in the contact area of the sensor component.

A further advantage of the present invention is to be seen in the fact that at the otherwise open lateral parting surface the metal film is completely and hermetically sealed against aggressive environmental influences, e.g. against an aggressive chemical atmosphere, by means of the sensor component arrangement according to the present invention, whereby the metal film will be prevented from detaching itself from the substrate support.

A further advantage of the present invention is to be seen in the fact that the adherence between the metal film and the ceramic support is prevented from loosening, whereby the contact quality between the metal film and the connecting wires will additionally be improved to a decisive extent. On the basis of these measures, a longer service life of the sensor component can be achieved even under extremely hard environmental conditions.

Preferred further developments of the present invention are defined in the subclaims.

In the following, preferred embodiments of the present invention will be explained in detail making reference to the drawings enclosed, in which:

FIGS. 1a and 1b show a rear view and a side view of a sensor component according to one embodiment of the present invention;

FIG. 2 shows a sectional view of a further development of a sensor component according to the present invention;

FIG. 3 shows a view of the contact area of the sensor component with an alternative configuration of the ends of the connecting wires;

FIG. 4 shows a rear view of a row of sensor components during the production;

FIG. 5 shows a platinum temperature sensor component known in the prior art.

Making reference to FIGS. 1a and 1b, a preferred embodiment of the sensor component according to the present invention is now described in detail.

The sensor component comprises a ceramic support 12 having a metal film 14 applied thereto. In this embodiment two connecting wires 16 in a contact area 18 are electrically connected to a respective contact surface of the metal film 14. A fixing glaze 20 is applied to the metal film 14 and the connecting wires 16 in the contact area 18. The metal film area which is located outside of the contact area 18 has applied thereto a glass passivation layer 22. The ceramic support 12 is provided with a recess or step 24 extending along the entire circumference thereof. This recess 24 is filled with a glass composition which is fixedly connected both to the ceramic support 12 and to the fixing glaze 20 by fusion.

As can be seen from FIGS. 1a and 1b, the step or recess 24 provided in the ceramic support is also arranged on the front, i.e. on the side at which the connecting wires 16 leave the contact area. This guarantees that exposed edges, which may be subject to aggressive environmental influences, are avoided on the sides of the sensor component.

FIGS. 1a and 1b clearly show that, in contrast to a sensor component known in the prior art, the fixing glaze 20 is applied not only to the connecting areas of the metal film 14 and the connecting wires 16 in the contact area 18, but, due to the fusion of the fixing glaze 20, it is also fixedly connected to the glass composition arranged in the recesses 24 and therefore also to the ceramic support 12. This mode of arrangement of the contact area 18 therefore provides additional mechanical interlocking between the fixing glaze 20 and the ceramic support 12.

The material for the metal film 14 applied to the ceramic support 12 can e.g. be platinum, nickle or some other suitable metal or a suitable metal alloy; the ceramic material for the ceramic support 12 can be an $Al_2O_3$ ceramic material, an $MgTiO_3$ ceramic material or some other suitable ceramic material.

In addition to the much better mechanical interlocking between the glaze composition and the ceramic support 12 achieved by the step, this arrangement additionally provides a hermetic seal of the metal film 14 against an aggressive chemical atmosphere at the otherwise open lateral parting surface. A loosening of the adherence between the metal film 14 and the ceramic support 12 is effectively prevented by the above-mentioned arrangement, the contact quality being decisively improved due to the fact that the fixing glaze 20 and the ceramic support 12 are mechanically interlocked. This will lead to a longer service life of the sensor component even under aggressive environmental conditions.

FIG. 2 shows a further embodiment of the contact surface of the metal film 14 in the contact area 18 of the sensor component. The metal film 14 has a comblike structure in the area of the contact surfaces, ceramic support areas being exposed between the metal film portions in this comblike structure. The exposed ceramic support areas are fixedly connected to the fixing glaze 20 by fusion. Especially in the case of comparatively large contact surfaces, the total adherence between the ceramic support 12 and the structured metal film 14 can be improved by this embodiment, since a comparatively large area of the ceramic support is directly connected to the fixing glaze 20.

This comblike metal film structure can be achieved by removing the metal film 14 in certain areas, e.g. by means of laser irradiation or plasma etching. Since the fixing glaze 20 is directly fused with the ceramic support 12 in a comparatively large area in the case of this arrangement, the additional mechanical interlocking between the fixing glaze 20 and the ceramic support 12 is increased once more. This will effectively prevent the metal film 14 from loosening or even detaching itself from the ceramic support 12.

FIG. 3 shows an embodiment of the connecting wire ends 16a in the contact area 18 within the fixing glaze 20. The connecting wire ends 16a have a slightly enlarged shape in the contact area within the fixing glaze 20. By means of this embodiment of the connecting wire ends 16a, the mechanical withdrawal force F of the connecting wires can be increased, since a wedging effect is achieved within the fixing glaze composition 20, whereby the maximum withdrawal force of the connecting wires 16 from the contact area 18 is substantially increased in the axial direction.

The arrangement of the sensor component structure according to the present invention and especially the arrangement of the contact area according to the present invention is achieved by sawing recesses or steps 24 into the ceramic support 12 while the sensor is being produced, i.e. after the application of a metal film 14 to the ceramic support 12; at the locations of sawing, the metal film 14 is removed simultaneously.

These recesses 24 are then filled with a suitable glass composition; it is also possible to use the fixing glaze composition 20 for filling the recesses 24. Since the connecting wires 16 are bonded to the metal-film contact surfaces provided, these connecting wires 16 are, in turn, encompassed by a fixing glaze composition and fused at a high temperature. In the course of this process, the fixing glaze composition 20 will fuse not only with the metal film 14 but also with the glass composition arranged laterally to this metal film 14 in the recesses 24 thus forming a uniform fixing means for the connecting wires 16.

This glass composition can be defined by the fixing glaze 20, which, during application to the contact area 18 and during fusion with the ceramic support 12, will spread in the liquid condition into the recesses 24 in the ceramic support 12, or it can also be applied to the recesses 24 separately of the fixing glaze composition 20 prior to be being fused with this fixing glaze composition 20.

FIG. 4 shows the arrangement of a row of sensor components during the above-described production process, before this row is divided into individual sensor components at the separating lines a, b, etc.

What is claimed is:

1. A sensor component comprising
   a planar ceramic support having a surface;
   a metal film applied to said ceramic support, the metal film having two connection ends on the surface;
   two connecting wires electrically connected to the metal film at a respective connection end in a contact area, and the two connection wires being positioned on top of the respective connection ends to achieve the electrical connection; and
   a non-conductive fixing glaze applied to the ceramic support, the metal film and the at least one connecting wire in the contact area;
   wherein the ceramic support has at least one recess in the contact area, the recess extending from the surface of the support into the support, the recess being filled with a glass composition or the non-conductive fixing glaze so that the mechanical interlocking between the fixing glaze and the ceramic support is improved by said at least one recess.

2. The sensor component according to claim 1, wherein the at least one recess is filled with a glass composition which is fixedly connected both to the ceramic support and to the non-conductive fixing glaze.

3. The sensor component according to claim 1, comprising a glass passivation layer which is applied on top of the metal film outside of the contact area.

4. The sensor component according to claim 1, wherein the metal film has a comblike structure in which ceramic support areas are exposed, the exposed ceramic support areas being fixedly connected to the non-conductive fixing glaze.

5. The sensor component according to claim 1, wherein the cross-section of the at least one connecting wire widens within the non-conductive fixing glaze in the connecting wire direction facing the ceramic support.

6. The sensor component according to claim 1, wherein the metal film consists of platinum or nickel.

7. The sensor component according to claim 1, wherein the ceramic-support material consists of an A1203 ceramic material or an MgTiO3 ceramic material.

8. A method of producing a sensor component comprising the steps of:
   applying a metal film to a surface of a planar ceramic support, the metal film having two connection ends;
   providing at least one recess in said ceramic support, the recess extending from the surface of the support into the support;
   positioning two connecting wires on top of a respective connection end of the metal film thereby electrically connecting the two connecting wires with the metal film at the respective connection end in a contact area;
   filling the recess with a non-conductive fixing glaze composition or a glass composition;
   applying the non-conductive fixing glaze composition to the connecting wire, the metal film and the at least one recess in the contact area; and
   fusing the non-conductive fixing glaze composition to the ceramic support, whereby due to the recess the mechanical interlocking between the fixing glaze and the ceramic support is improved.

9. The method according to claim 8, further comprising the steps of:
   filling the at least one recess with a glass composition after the step of providing said recess;
   applying a glass passivation layer to the metal film outside of the contact area after the step of applying the non-conductive fixing glaze composition;
   wherein the fusion step comprises the fusing of the glass composition in the at least one recess with the ceramic support and the non-conductive fixing glaze composition.

10. The method of producing a sensor component according to claim 8, further comprising the steps of:
    producing a comblike structure of the metal film by laser irradiation or plasma etching; and
    providing the at least one recess by sawing said recesses into the ceramic support material.

11. A sensor component comprising:
    a ceramic support;
    a metal film applied to said ceramic support;
    at least one connecting wire electrically connected to the metal film in a contact area; and
    a non-conductive fixing glaze applied to the metal film and the at least one connecting wire in the contact area;
    wherein the ceramic support has at least one recess in the area of the non-conductive fixing glaze, and
    wherein the cross-section of the at least one connecting wire widens within the non-conductive fixing glaze in the connecting wire direction facing the ceramic support.

12. The sensor component according to claim 11, wherein the at least one recess is filled with a glass composition which is fixedly connected both to the ceramic support and to the non-conductive fixing glaze.

13. The sensor component according to claim 11, comprising a glass passivation layer which is applied on top of the metal film outside of the contact area.

14. The sensor component according to claim 11, wherein the metal film has a comblike structure in which ceramic support areas are exposed, the exposed ceramic support areas being fixedly connected to the non-conductive fixing glaze.

15. The sensor component according to claim 11, wherein the metal film consists of platinum or nickel.

16. The sensor component according to claim 11, wherein the ceramic-support material consists of an A1203 ceramic material or an MgTiO3 ceramic material.

17. A method of producing a sensor component comprising the steps of:
    applying a metal film to a ceramic support;
    producing a comblike structure of the metal film by laser irradiation or plasma etching;
    providing at least one recess in said ceramic support by sawing said recesses into the ceramic support material;
    electrically connecting the metal film to at least one connecting wire in a contact area;

applying a non-conductive fixing glaze composition to the connecting wire, the metal film and the at least one recess in the contact area; and fusing the non-conductive fixing glaze composition to the ceramic support.

18. The method according to claim 17, further comprising the steps of:

filling the at least one recess with a glass composition after the step of providing said recess;

applying a glass passivation layer to the metal film outside of the contact area after the step of applying the non-conductive fixing glaze composition;

wherein the fusion step comprises the fusing of the glass composition in the at least one recess with the ceramic support and the non-conductive fixing glaze composition.

* * * * *